(12) United States Patent
Booth et al.

(10) Patent No.: US 9,252,201 B2
(45) Date of Patent: Feb. 2, 2016

(54) METHOD OF FORMING BACK-END-OF-LINE PLANAR RESISTOR

(71) Applicant: International Business Machines Corporation, Armonk, NY (US)

(72) Inventors: Roger A. Booth, Wappingers Falls, NY (US); Lawrence A. Clevenger, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 407 days.

(21) Appl. No.: 13/780,942

(22) Filed: Feb. 28, 2013

(65) Prior Publication Data

US 2013/0178041 A1 Jul. 11, 2013

Related U.S. Application Data

(62) Division of application No. 12/946,294, filed on Nov. 15, 2010, now Pat. No. 8,455,768.

(51) Int. Cl.
*H05K 3/30* (2006.01)
*H01L 49/02* (2006.01)
*H01L 21/311* (2006.01)
(Continued)

(52) U.S. Cl.
CPC .......... *H01L 28/20* (2013.01); *H01L 21/31116* (2013.01); *H01L 21/31144* (2013.01); *H01L 21/76808* (2013.01); *H01L 21/76831* (2013.01); *H01L 23/5228* (2013.01); *H01L 23/5329* (2013.01); *H01L 23/53295* (2013.01); *H01L 28/24* (2013.01); *H01L 2924/0002* (2013.01); *H01L 2924/12044* (2013.01); *Y10T 29/4913* (2015.01); *Y10T 29/49082* (2015.01); *Y10T 29/49155* (2015.01)

(58) Field of Classification Search
CPC . H01L 28/20; H01L 23/5228; H01L 27/0802; H05K 1/0234; Y10T 29/49117; Y10T 29/49124; Y10T 29/4913; Y10T 29/49155; Y10T 29/49099; Y10T 29/49082; H01C 1/148; H01C 7/006; Y10S 148/136
USPC ............ 29/832, 825, 829, 846, 852; 257/529, 257/532, 536, 538, E21.004, E27.047
See application file for complete search history.

(56) References Cited

U.S. PATENT DOCUMENTS 5,316,978 A * 5/1994 Boyd ...................... H01L 28/20
148/DIG. 136
5,466,484 A * 11/1995 Spraggins ........... H01L 27/0802
257/529

(Continued)

*Primary Examiner* — Thiem Phan
(74) *Attorney, Agent, or Firm* — Scully, Scott, Murphy & Presser, P.C.; Steven J. Meyers, Esq.

(57) ABSTRACT

A stack of an interconnect-level dielectric material layer and a disposable dielectric material layer is patterned so that at least one recessed region is formed through the disposable dielectric material layer and in an upper portion of the interconnect-level dielectric material layer. A dielectric liner layer and a metallic liner layer is formed in the at least one recessed region. At least one photoresist is applied to fill the at least one recessed region and lithographically patterned to form via cavities and/or line cavities in the interconnect-level dielectric material layer. After removing the at least one photoresist, the at least one recessed region, the via cavities, and/or the line cavities are filled with at least one metallic material, which is subsequently planarized to form at least one planar resistor having a top surface that is coplanar with top surfaces of metal lines or metal vias.

20 Claims, 11 Drawing Sheets

(51) Int. Cl.
*H01L 21/768* (2006.01)
*H01L 23/522* (2006.01)
*H01L 23/532* (2006.01)

(56) References Cited

U.S. PATENT DOCUMENTS

| | | | |
|---|---|---|---|
| 6,159,842 A | 12/2000 | Chang et al. | |
| 6,534,374 B2 | 3/2003 | Johnson et al. | |
| 6,709,918 B1 | 3/2004 | Ng et al. | |
| 7,242,074 B2 * | 7/2007 | Erickson | H01L 28/20 257/532 |
| 7,271,700 B2 | 9/2007 | Chinthakindi et al. | |
| 7,301,107 B2 | 11/2007 | Karthikeyan et al. | |
| 7,303,972 B2 | 12/2007 | Coker et al. | |
| 7,382,055 B2 | 6/2008 | Coker et al. | |
| 7,633,373 B1 | 12/2009 | Johnson et al. | |
| 2007/0040239 A1 | 2/2007 | Chinthakindi et al. | |
| 2007/0166909 A1 | 7/2007 | Coker et al. | |
| 2007/0290272 A1 | 12/2007 | Coker et al. | |

* cited by examiner

METHOD OF FORMING BACK-END-OF-LINE PLANAR RESISTOR

REFERENCES TO RELATED APPLICATIONS

The instant application is a divisional of U.S. patent application Ser. No. 12/946,294 filed on Nov. 15, 2010, the entire disclosure and contents of which are incorporated herein by reference.

BACKGROUND

The present disclosure relates to a metal structure embedded in a dielectric material layer, and particularly to a back-end-of-line (BEOL) resistor including a patterned metallic layer embedded in a dielectric material layer and methods of forming the same.

A resistor is a passive component integrated into many semiconductor circuits to provide various useful functions. Typically, resistors in semiconductor circuits are formed employing front-end-of-line (FEOL) processing steps, which are performed before formation of the lowest level contact via structures. For example, resistors can be formed by patterning a doped polysilicon film or a metal semiconductor alloy during FEOL processing steps, thereby providing "FEOL resistors."

Although a FEOL resistor tends to provide adequate functionality, each FEOL resistor also requires an area on a semiconductor substrate, which cannot be employed to form other semiconductor devices. Thus, unlike devices formed in BEOL levels, any area used up by an FEOL resistor cannot be employed for any other type of FEOL device such as field effect transistors, bipolar transistors, diodes, capacitors, etc.

BRIEF SUMMARY

A back-end-of-line resistor (BEOL) can be formed in an upper portion of a dielectric material layer that includes metal interconnect structures. A stack of an interconnect-level dielectric material layer and a disposable dielectric material layer is patterned so that at least one recessed region is formed through the disposable dielectric material layer and in an upper portion of the interconnect-level dielectric material layer. A dielectric liner layer and a metallic liner layer is formed in the at least one recessed region. At least one photoresist is applied to fill the at least one recessed region and lithographically patterned to form via cavities and/or line cavities in the interconnect-level dielectric material layer. After removing the at least one photoresist, the at least one recessed region, the via cavities, and/or the line cavities are filled with at least one metallic material, which is subsequently planarized to form at least one planar resistor having a top surface that is coplanar with top surfaces of metal lines or metal vias.

According to an aspect of the present disclosure, a structure includes: a metal interconnect structure embedded in a dielectric material layer and having a top surface that is coplanar with a topmost surface of the dielectric material layer; and a metallic liner embedded in the dielectric material layer, not contacting the metal interconnect structure, and having a thickness that is less than a vertical distance between the top surface of the metal interconnect structure and any planar bottom surface of the metal interconnect structure.

According to another aspect of the present disclosure, a method of forming a structure includes: forming at least one recessed region in a dielectric material layer located on a substrate, wherein a surface of the dielectric material layer is present at a bottom of the at least one recessed region; depositing a metallic liner layer in the at least one recessed region; forming at least one cavity in the dielectric material layer after depositing the metallic liner, wherein the cavity extends to a bottom surface of the dielectric material layer; filling the at least one cavity and the at least one recessed region with a metallic material; and planarizing the metallic material, wherein at least one metallic liner including a remaining portion of the metallic liner layer is formed in the at least one recessed region and at least one metal interconnect structure including the metallic material is formed within the at least one cavity.

DETAILED DESCRIPTION

Figure 1:
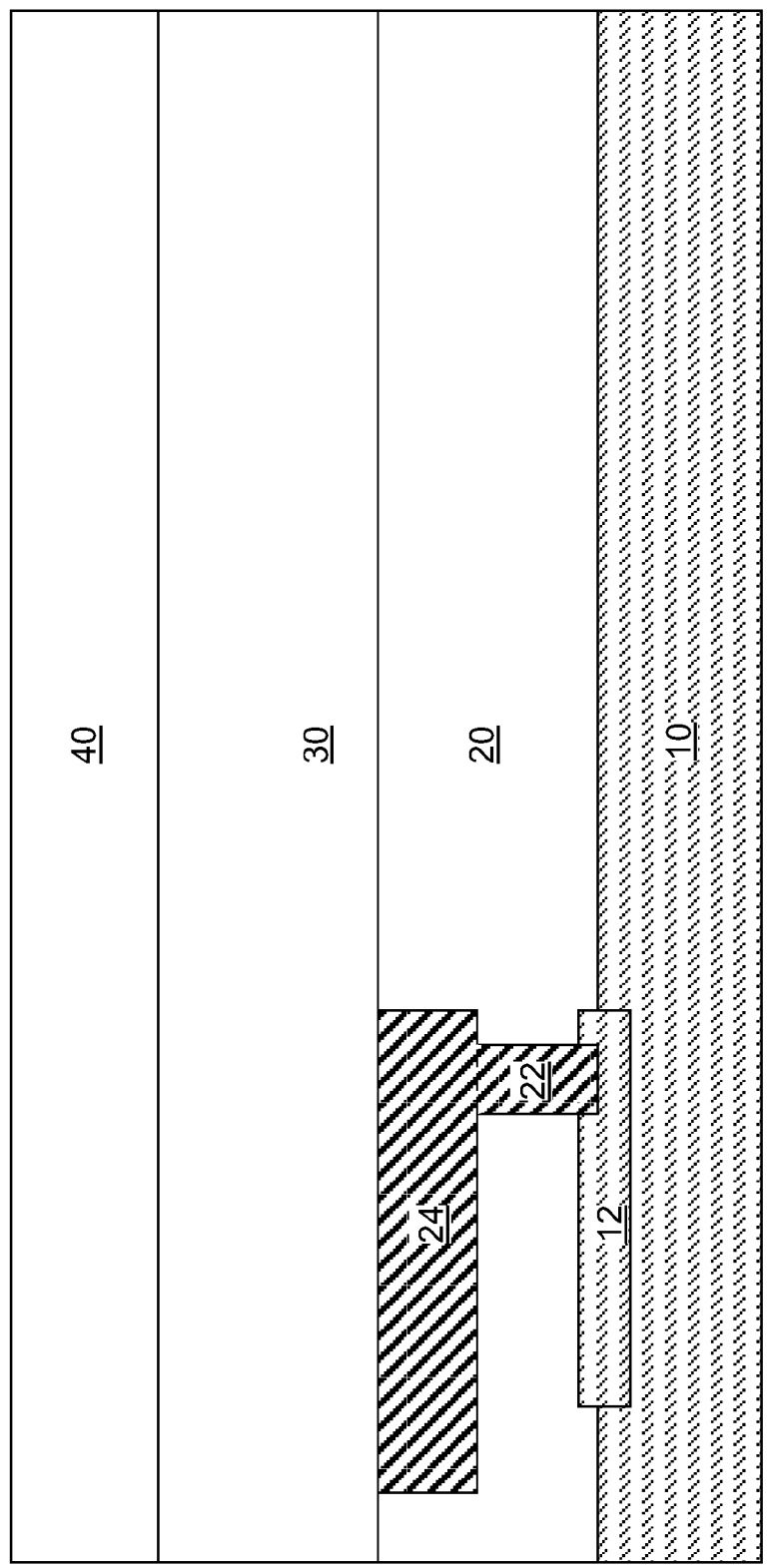
FIG. 1 is a vertical cross-sectional view of an exemplary structure after formation of an interconnect-level dielectric material layer and a disposable dielectric material layer according to an embodiment of the present disclosure.

As stated above, the present disclosure relates to a back-end-of-line (BEOL) resistor including a patterned metallic layer embedded in a dielectric material layer and methods of forming the same, which are now described in detail with accompanying figures. It is noted that like and corresponding elements are referred to by like reference numerals. The drawings are not in scale. Further, it is noted that sidewalls of various elements may have some taper although most elements are shown to have vertical sidewalls throughout the drawings.

Referring to FIG. 1, an exemplary structure according to an embodiment of the present disclosure includes a stack of a substrate 10, an underlying-level dielectric layer 20, an interconnect-level dielectric material layer 30, and a disposable dielectric material layer 40.

The substrate 10 can be a semiconductor substrate including a semiconductor material, which can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material comprises silicon. The substrate 10 can be a bulk substrate or a semiconductor-on-insulator (SOI) substrate.

At least one semiconductor device 12 may be present on the substrate 10. The at least one semiconductor device 12 can be a field effect transistor, a bipolar transistor, a diode, a resistor, a capacitor, an inductor, an electrically programmable fuse, or any combination thereof.

The underlying-level dielectric layer 20 can be a single dielectric material layer, a plurality of dielectric material layers, or can be absent depending on the implementation of the present disclosure. At least one conductive via structure 22 and/or at least one conductive line structure 24 can be embedded in the underlying-level dielectric layer 20. The least one conductive via structure 22 and/or at least one conductive line structure 24 are collectively referred to as underlying-level conductive interconnect structures, and are typically metallic structures, i.e., underlying-level metal interconnect structures.

The interconnect-level dielectric material layer 30 includes a dielectric material, which can be a conventional dielectric material such as undoped silicon oxide (undoped silicate glass), doped silicon oxide (doped silicate glass), silicon oxynitride, silicon nitride, or a combination thereof, or can be a low dielectric constant (low-k) material, which refers to a dielectric material having a dielectric constant less than the dielectric constant of silicon oxide, i.e., 3.9. Low dielectric constant materials that can be employed for the interconnect-level dielectric material layer 30 include organosilicate glass including Si, C, O, H, and optionally N, and methylated-hydrogen silsesquioxane (MSQ). The low dielectric constant material can be deposited by chemical vapor deposition or by spin-coating, and can be porous or non-porous. The interconnect-level dielectric material layer 30 is formed at an interconnect level, i.e., at a level in which metal interconnect structures are subsequently formed. The thickness of the interconnect-level dielectric material layer 30 can be from 30 nm to 600 nm, and typically from 60 nm to 300 nm, although lesser and greater thicknesses can also be employed.

The disposable dielectric material layer 40 can include includes silicon, carbon, hydrogen, and oxygen and/or nitrogen, or alternatively silicon, carbon, fluorine, and oxygen and/or nitrogen, or yet alternatively, silicon, carbon, hydrogen, fluorine, and oxygen and/or nitrogen. The disposable dielectric material layer 40 can be formed by a chemical vapor deposition (CVD) process or metal organic chemical vapor deposition (MOCVD). The precursors that can be employed to deposit the disposable dielectric material layer 40 include, but are not limited to, organic siloxanes, fluorosiloxanes, cyclosiloxanes, fluorine containing cyclosiloxanes, organosilazanes, fluorosilazanes, cyclosilazane, silicates, tetraethyl orthosilicate (TEOS), and tetramethylsilane (TMS), cyclic organosilicons, and mixtures thereof. Examples of cyclic organosilicons include cyclic organosilicons include cyclosiloxanes such as octamethylcyclotetrasiloxane (OMCTS), hexamethylcyclotrisiloxane, hexaphenylcyclotrisiloxane, octaphenylcyclotetrasiloxane, 1,3,5-trimethyl-1,3,5-tris-3,3,3-trifluoropropylcyclotrisiloxane, and fluorine containing cyclosiloxanes.

In an exemplary embodiment, the precursor is OMCTS, and the disposable dielectric material layer 40 is an organosilicate glass (OSG) deposited in a chemical vapor deposition process employing OMCTS as a precursor. Typically, the disposable dielectric material layer 40 has a dielectric constant less than 3.9, which is the dielectric constant of undoped silicon oxide. In some embodiment, the disposable dielectric material layer 40 has a dielectric constant less than 3.0. The disposable dielectric material layer 40 can be porous or non-porous. The composition of the disposable dielectric material layer 40 can be different from the composition of the interconnect-level dielectric material layer 30. The thickness of the disposable dielectric material layer 40 can be from 30 nm to 300 nm, and typically from 50 nm to 200 nm, although lesser and greater thicknesses can also be employed.

Figure 2:
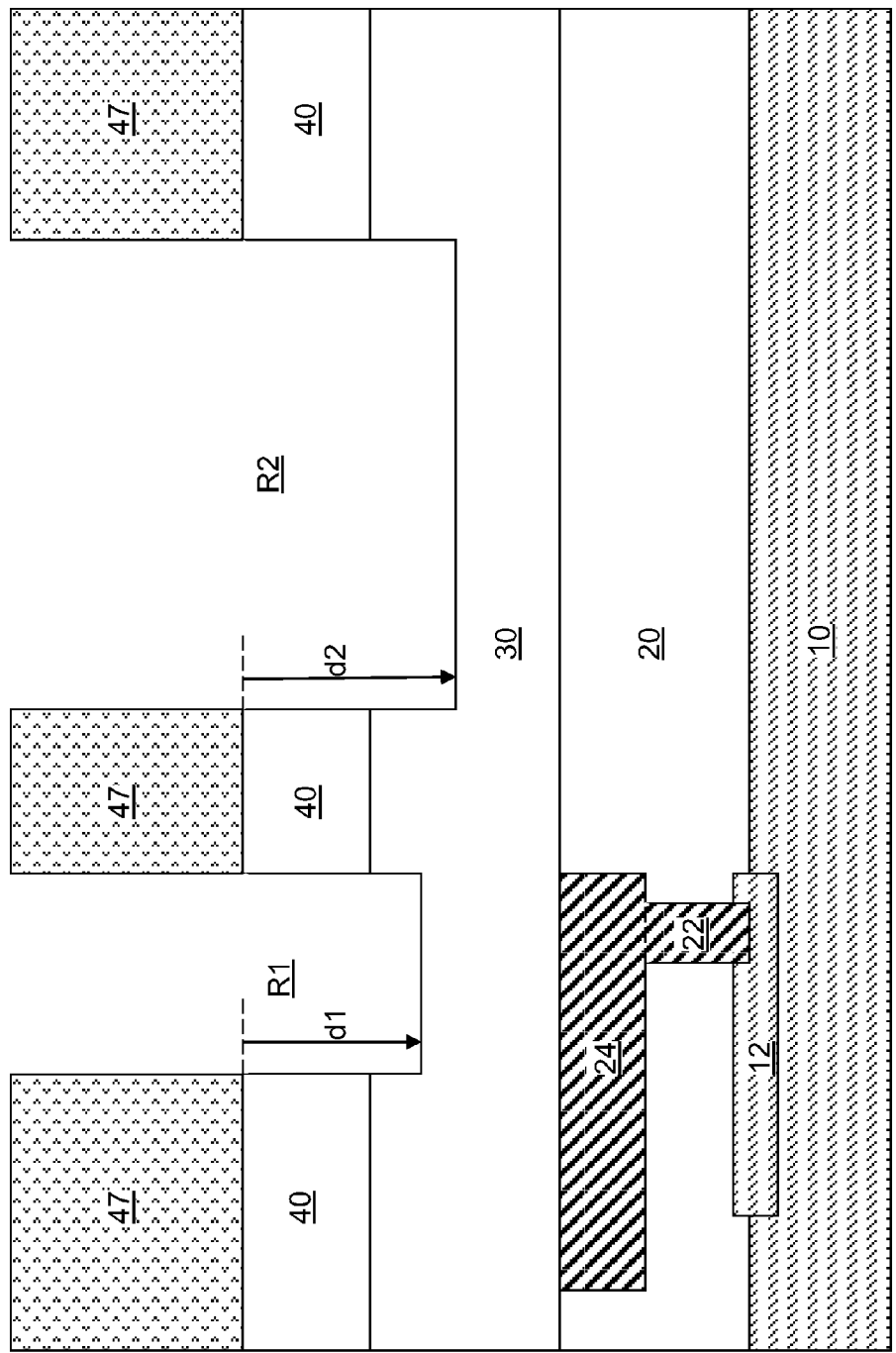
FIG. 2 is a vertical cross-sectional view of the exemplary structure of FIG. 1 after formation of at least one recessed region according to an embodiment of the present disclosure.

Referring to FIG. 2, at least one recessed region is formed in the disposable dielectric material layer 40 and an upper portion of the interconnect-level dielectric material layer 30. The at least one recessed region can be formed, for example, by applying a photoresist 47 on a top surface of the disposable dielectric material layer 40 and lithographically patterning at least one hole therein. The photoresist 47 may contain at least one anti-reflective coating (ARC) layer (not shown separately).

The pattern in the photoresist 47 is transferred through the disposable dielectric material layer 40 and into the upper portion of the interconnect-level dielectric material layer 30 by an etch employing the photoresist 47 as an etch mask. The etch can be anisotropic or isotropic. Further, the etch can be a wet etch or a dry etch. The sidewalls of the disposable dielectric material layer 40 in each recessed region can be substantially vertical, or can have a non-zero taper angle, i.e., a non-zero angle between the sidewalls of the disposable dielectric material layer 40. In one embodiment, the etch is an anisotropic etch such as a reactive ion etch (RIE) an upper periphery of the sidewalls of the disposable dielectric material layer 40 coincides with a periphery of a hole in the photoresist 47.

The at least one hole can in the photoresist 47 can include a first hole located in a first area and a second hole located in a second area. Correspondingly, the at least one recessed region in the disposable dielectric material layer 40 and the upper portion of the interconnect-level dielectric material layer 30 can include a first recessed region R1 in the first area and a second recessed region R2 in the second area. In an illustrative example, the first recessed region R1 can be narrower than the second recessed region R2. The first recessed region R1 can have a first depth $d_1$, which is the vertical distance between the top surface of the disposable dielectric material layer 40 and the bottom surface of the first recessed region R1, and second recessed region R2 can have a second depth $d_2$, which is the vertical distance between the top surface of the disposable dielectric material layer 40 and the bottom surface of the second recessed region R2.

In one embodiment, the etch chemistry can be selected so that the depth of each recessed region is independent of the area of the recessed region. In this embodiment, the first depth d1 is the same as the second depth d2.

In another embodiment, the etch chemistry can be selected so that the etch rate is dependent on the width of the recessed region. In this embodiment, the first depth d1 is different from the second depth d2. In one case, the second depth d2 can be greater than the first depth d1. Such differential etch rates depending on the width of a recessed region can be obtained, for example, if the etch chemistry is a type that generates a significant amount etch residues (such as polymers) on the sidewalls of the recessed regions (R1, R2). In this case, the etch residues interfere with etching of the dielectric materials in the disposable dielectric material layer 40 and the upper portion of the interconnect-level dielectric material layer 30. Typically, the sidewalls of the recessed regions (R1, R2) tend to have a significant taper (up to 20 degrees).

In another case, the second depth d2 can be less than the first depth d1. Such differential etch rates depending on the width of a recessed region can be obtained, for example, if the etch chemistry is depletive, i.e., limited by the local supply of etchant, as in a reactive ion etch with limited supply of etchant gases. In this case, not enough etchant is available in a recessed region having a large area such as the second recessed region R2, while a narrow recessed region such as the first recessed region R1 does not suffer from such limitation on availability of etchant gases. Thus, the first depth d1 can be greater than the second depth d2. Typically, the sidewalls of the recessed regions (R1, R2) tend to be substantially vertical in this case.

The magnitude of variations in the differential etch rates can be optimized by selecting the etch chemistry and the processing conditions of the etch process. While the present disclosure is illustrated employing an example in which the second depth d2 is greater than the first depth d1, structures corresponding to embodiments in which the second depth d2 is less than the first depth d1 can be constructed by one of ordinary skill in the art by altering the lateral dimensions of the first and second recessed regions (R1, R2) and the structures formed therein. In other words, the ratio of the width of the first recessed region R1 to the width of the second recessed region R2 may be less than 1 or may be greater than 1, although the drawings herein illustrate a case in which the ratio of the width of the first recessed region R1 to the width of the second recessed region R2 is less than 1.

The first depth d1 and the second depth d2 are selected to be less than the height of metal lines to be subsequently formed in the interconnect-level dielectric material layer 30. Thus, the first and second recessed regions (R1, R2) do not extend to the bottom surface of the interconnect-level dielectric material layer 30. Typically, the vertical distance between the bottom surface of a recessed region (R1 or R2) and the top surface of the interconnect-level dielectric material layer 40 is between 3% and 40% of the thickness of the interconnect-level dielectric material layer 40, and is typically from 5% to 20% of the thickness of the interconnect-level dielectric material layer 40. The photoresist 47 is subsequently removed, for example, by ashing.

Figure 3:
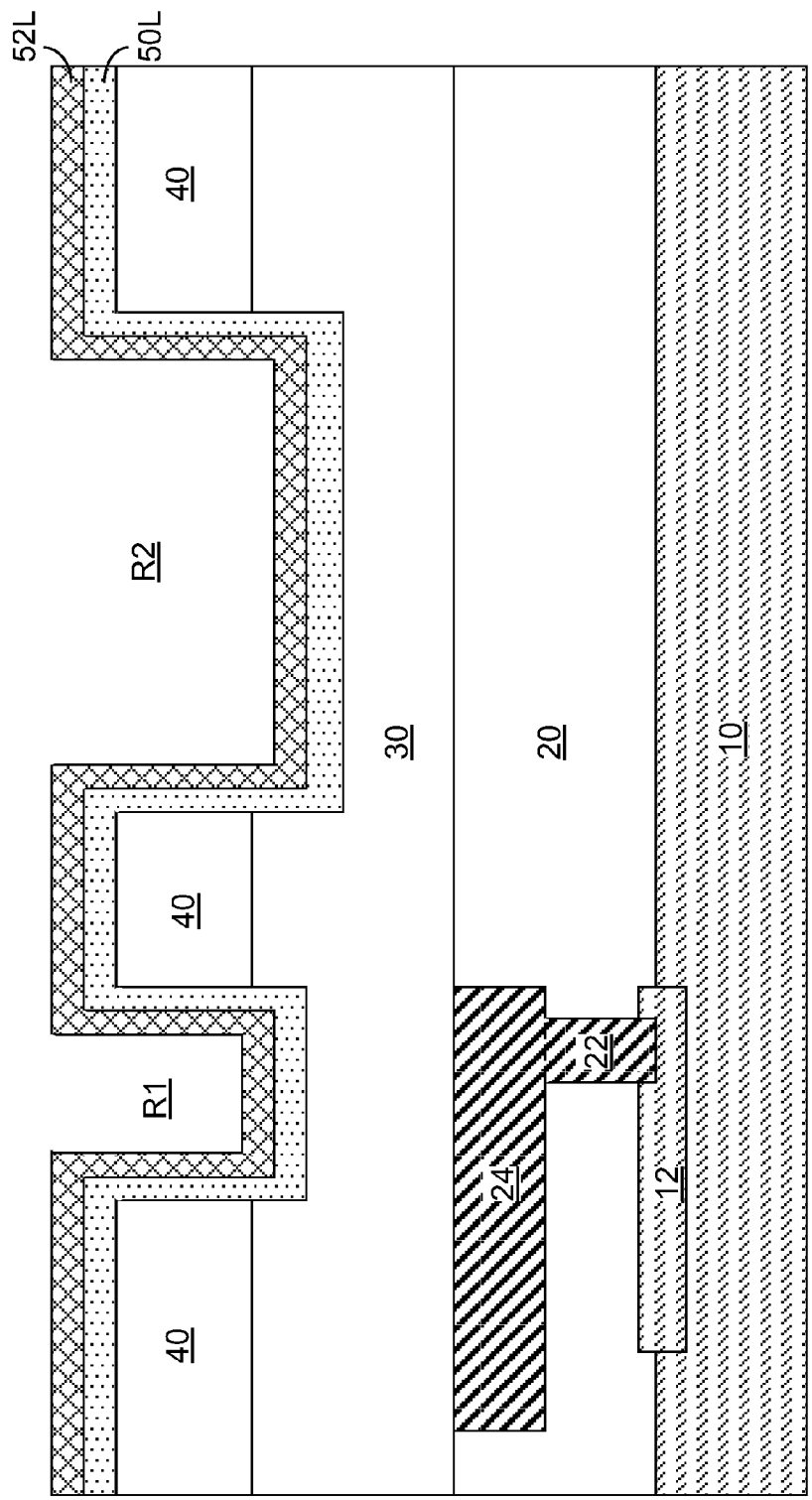
FIG. 3 is a vertical cross-sectional view of the exemplary structure of FIG. 2 after formation of a stack of a dielectric liner layer and a metallic liner layer according to an embodiment of the present disclosure.

Referring to FIG. 3, a stack of a dielectric liner layer 50L and a metallic liner layer 52 L is deposited in the at least one recessed regions (R1, R2) and over the top surface of the disposable dielectric material layer 40. Specifically, the dielectric liner layer 50L is deposited directly on exposed top surfaces and sidewall surfaces of the dielectric material layer 30 in the at least one recessed region (R1, R2), and the top surface and sidewalls of the disposable dielectric material layer 40. The metallic liner layer 52L is deposited directly on the dielectric liner layer 50L in the at least one recessed region (R1, R2) and the topmost surface of the dielectric liner layer 50L.

The dielectric liner layer 50L includes a dielectric material different from the dielectric material of the interconnect-level dielectric material layer 30. In one embodiment, the dielectric liner layer 50L includes a dielectric material providing greater mechanical strength, i.e., greater ability to withstand an applied stress without failure, than the dielectric material of the interconnect-level dielectric material layer 30. For example, the dielectric material of the interconnect-level dielectric material layer 30 can be a porous or non-porous low-k dielectric material having a dielectric constant less than 3.9, and the dielectric material of the dielectric liner layer 50 can be a non-low-k dielectric material, i.e., a dielectric material having a dielectric constant of at least 3.9, such as silicon oxide, silicon nitride, silicon oxynitride, a hydrogenated silicon carbide (commonly referred to as BLoK™), a nitrogen-doped hydrogenated silicon carbide (commonly referred to as NBloK™), or a combination thereof. The dielectric liner layer 50L can be deposited by a conformal deposition, in which case the thickness of the dielectric liner layer 50L is constant through the horizontal portions and the vertical or tapered portions thereof, or a non-conformal deposition, in which case the thickness of vertical or tapered portions of the dielectric liner layer 50L is less than the thickness of the horizontal portions of the dielectric liner layer 50L. For example, the dielectric liner layer 50L can be deposited by plasma enhanced chemical vapor deposition (PECVD), sub-atmospheric chemical vapor deposition (SACVD), and/or high density plasma chemical vapor deposition (HDPCVD).

The thickness of the dielectric liner layer 50L, as measured directly on a recessed planar (horizontal) surface of the interconnect-level dielectric material layer 30 in the at least one recessed region (R1, R2), can be from 3 nm to 100 nm, although lesser and greater thicknesses can also be employed. The top surface of the horizontal portions of the dielectric liner layer 50L in the at least one recessed region (R1, R2) is located below the level of the interface between the interconnect-level dielectric material layer 30 and the disposable dielectric material layer 40 by a vertical distance, which can be from 2 nm to 150 nm, and typically from 5 nm to 75 nm, although lesser and greater vertical distances can also be employed.

The metallic liner layer 52L includes a metallic material. In one embodiment, the metallic material of the metallic liner layer has a relatively high resistivity than conventional conductive materials employed for metal interconnect structures such as W, Al, and Cu. For example, the metallic liner layer 52L can include a conductive metallic nitride such as TaN, TiN, WN, or a combination thereof. The metallic liner layer 52L can be deposited by a non-conformal deposition process such as physical vapor deposition (PVD), depletive chemical vapor deposition (CVD), vacuum evaporation, or a combination thereof, or can be deposited by a conformal deposition process such as non-depletive chemical vapor deposition. The thickness of the metallic liner layer 52L, are measured directly on a horizontal portion of the dielectric liner layer 50L in the at least one recessed region (R1, R2) can be from 3 nm to 100 nm, although lesser and greater thicknesses can also be employed. The top surface of a horizontal portion of the metallic liner layer 52L within the at least one recessed region (R1, R2) can be located below, at, or above, the level of the interface between the interconnect-level dielectric material layer 30 and the disposable dielectric material layer 40 depending on the depths of the at least one recessed region (R1, R2) (e.g., the first depth d1 and the second depth d2; see FIG. 2) and the thicknesses of the dielectric liner layer 50L and the metallic liner layer 52L.

Figure 4:
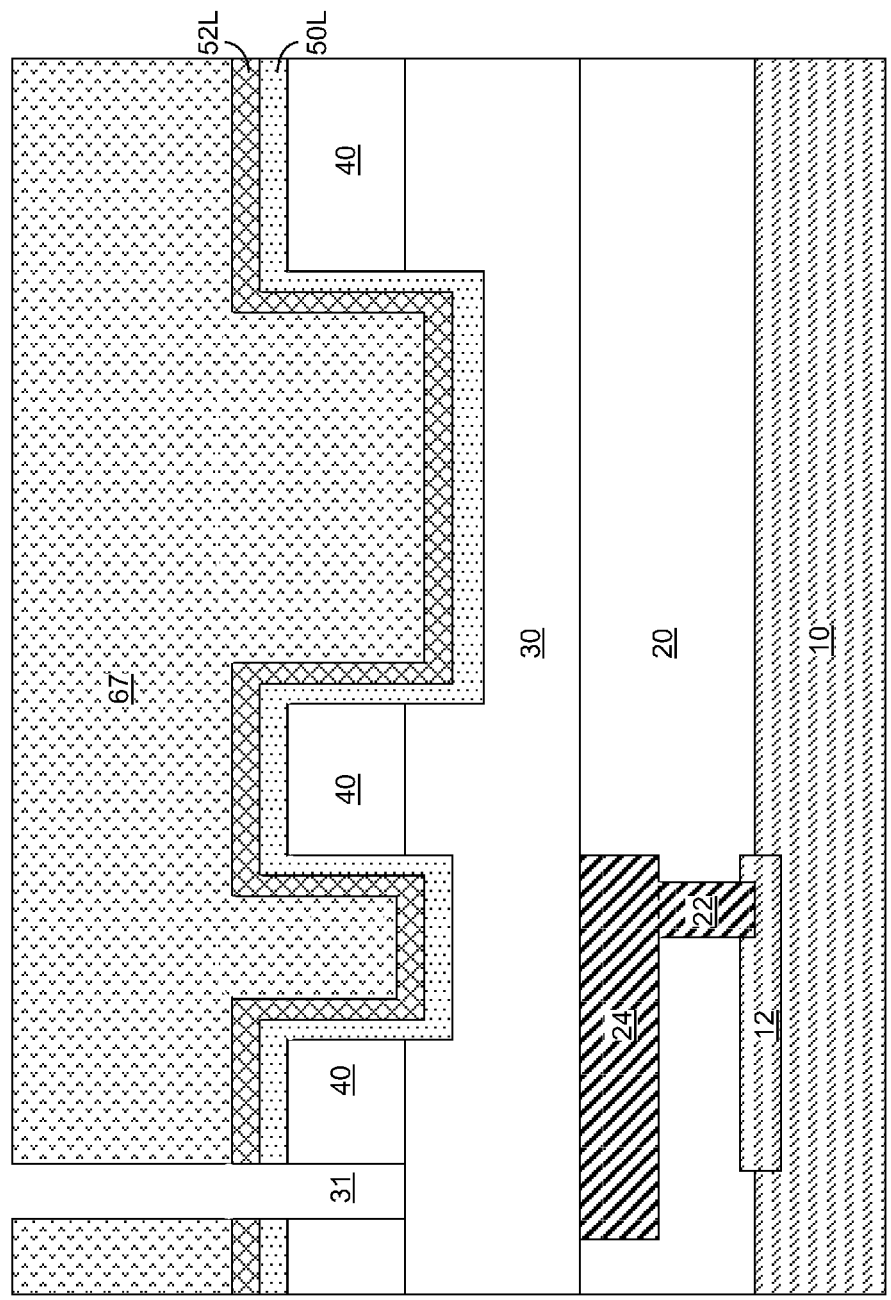
FIG. 4 is a vertical cross-sectional view of the exemplary structure of FIG. 3 after formation of at least one via cavity in the disposable dielectric material layer according to an embodiment of the present disclosure.

Referring to FIG. 4, a first photoresist 67 is applied over the metallic liner layer 52L and is lithographically pattern to include at least one hole in areas outside the areas of the at least one recessed regions (R1, R2; see FIG. 3), i.e., in areas in which the topmost surface of the disposable dielectric material layer 40 is present. The first photoresist 67 may include an optically planarizing layer (OPL; not separately shown) including a planarizing polymer and/or at least one anti-reflective coating (ARC) layer (not separately shown) as known in the art. The first photoresist 67 can be lithographically patterned to include at least one hole that corresponds to the location(s) of at least one contact via to be subsequently formed in the interconnect-level dielectric material layer 30.

The pattern in the first photoresist 67 is transferred through the metallic liner layer 52L and the dielectric liner layer 50L and into the disposable dielectric material layer 40 to form at least one via cavity 31, i.e., at least one cavity having a horizontal cross-sectional area of a contact via to be subsequently formed, within the disposable dielectric material layer 40. The pattern transfer from the first photoresist 67 into the metallic liner layer 52L, the dielectric liner layer 50L, and the disposable dielectric material layer 40 can be effected by an anisotropic etch, such as a reactive ion etch, that employs the first photoresist 67 as an etch mask. In one embodiment, the etch chemistry employed in the anisotropic etch can be selected to stop on the top surface of the interconnect-level dielectric material layer 30, i.e., the etch chemistry can etch the material of the disposable dielectric material layer selective to the material of the interconnect-level dielectric material layer 30. In another embodiment, the etch processes can be endpointed so that the etch process can terminate upon detection of byproducts of an etch of the dielectric material in the interconnect-level dielectric material layer 30 as known in the art. Thus, the at least one via cavity can extend through the metallic liner layer 52L, the dielectric liner layer 50L, and into the disposable dielectric material layer 40. The first photoresist 67 is subsequently removed, for example, by ashing.

Figure 5:
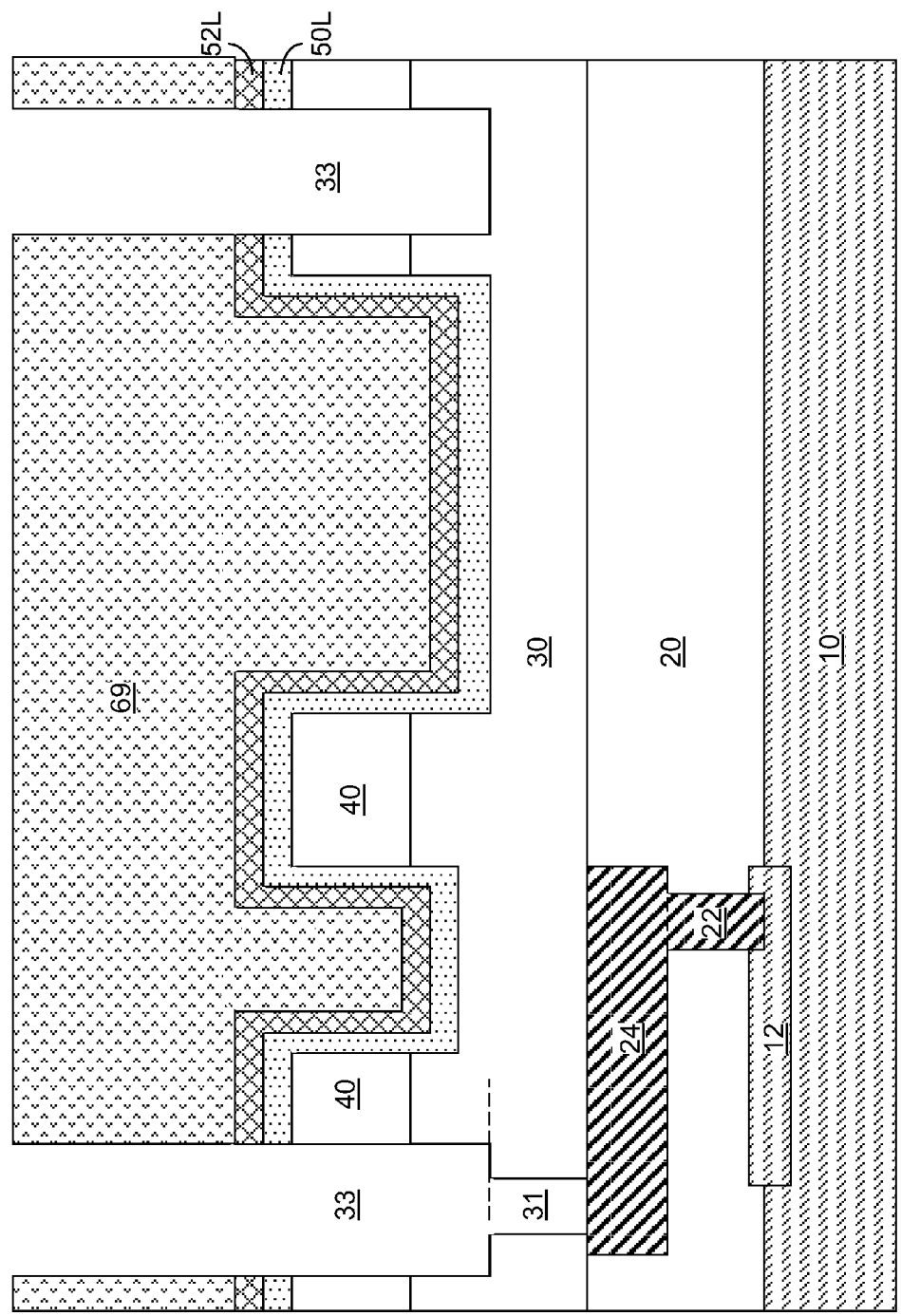
FIG. 5 is a vertical cross-sectional view of the exemplary structure of FIG. 4 after formation of at least one line cavity and at least one via cavity in the interconnect-level dielectric material layer according to an embodiment of the present disclosure.

Referring to FIG. 5, a second photoresist 69 is applied over the metallic liner layer 52L and is lithographically pattern to include at least one hole in areas outside the areas of the at least one recessed regions (R1, R2; see FIG. 3). The second photoresist 69 may include an optically planarizing layer (OPL; not separately shown) including a planarizing polymer and/or at least one anti-reflective coating (ARC) layer (not separately shown) as known in the art. The second photoresist 69 can be lithographically patterned to include at least one hole that corresponds to the location(s) of at least one metal line to be subsequently formed in the interconnect-level dielectric material layer 30. In this case, the at least one hole in the second photoresist 69 can be line-shaped, i.e., have a horizontal cross-sectional area corresponding to metal lines.

The pattern in the second photoresist 69 is transferred through the metallic liner layer 52L, the dielectric liner layer 50L, the disposable dielectric material layer 40, and into an upper portion of the interconnect level dielectric material layer 30 to form at least one line trench 33 therein. The pattern transfer from the second photoresist 69 into the metallic liner layer 52L, the dielectric liner layer 50L, the disposable dielectric material layer 40, and the upper portion of the interconnect level dielectric material layer 30 can be effected by an anisotropic etch, such as a reactive ion etch, that employs the second photoresist 69 as an etch mask. The at least one line trench 33 extends at least from the topmost surface of the metallic liner layer 52L to a level between the top surface and the bottom surface of the interconnect-level dielectric material layer 30.

In one embodiment, a bottom surface of the at east one line trench 33 is located below the bottommost surface of the dielectric liner layer 50L. The pattern of the at least one via cavity 31, which is present within the disposable dielectric material layer 40 prior to the formation of the at least one line trench 33 (See FIG. 4), is transferred downward until the at least one via cavity 31 reaches the bottommost surface of the interconnect-level dielectric material layer 30. A top surface of an underlying-level metal interconnect structure in the underlying-level dielectric material layer 20 is exposed, which can be a top surface of the at least one conductive line structure 24.

In one embodiment, the etch chemistry employed in the anisotropic etch can be selected to stop on the top surface of the at least one conductive line structure 24. In another embodiment, the etch processes can be endpointed so that the etch process can terminate upon detection of byproducts of an etch of the at least one conductive line structure 24. In yet another embodiment, the etch process may be timed so that a planar bottom surface of the at east one line trench 33 is formed at a predetermined level within the interconnect-level dielectric material layer 30.

Each of the at least one via cavity 31 is contiguously connected to one of the at least one line trench 33, which collectively form a single contiguous cavity extending from the topmost surface of the metallic liner layer 52L to the bottommost surface of the interconnect-level dielectric material layer 30. The vertical distance between the bottom surface of the at least one line trench 33 and the bottom surface of the interconnect-level dielectric material layer 30, i.e., the height of the at least one via cavity 31, can be from 25% to 75%, and typically from 40% to 65% of the total thickness of the interconnect-level dielectric material layer 30, although lesser and greater vertical distances can also be employed. The second photoresist 69 is subsequently removed, for example, by ashing.

Figure 6:
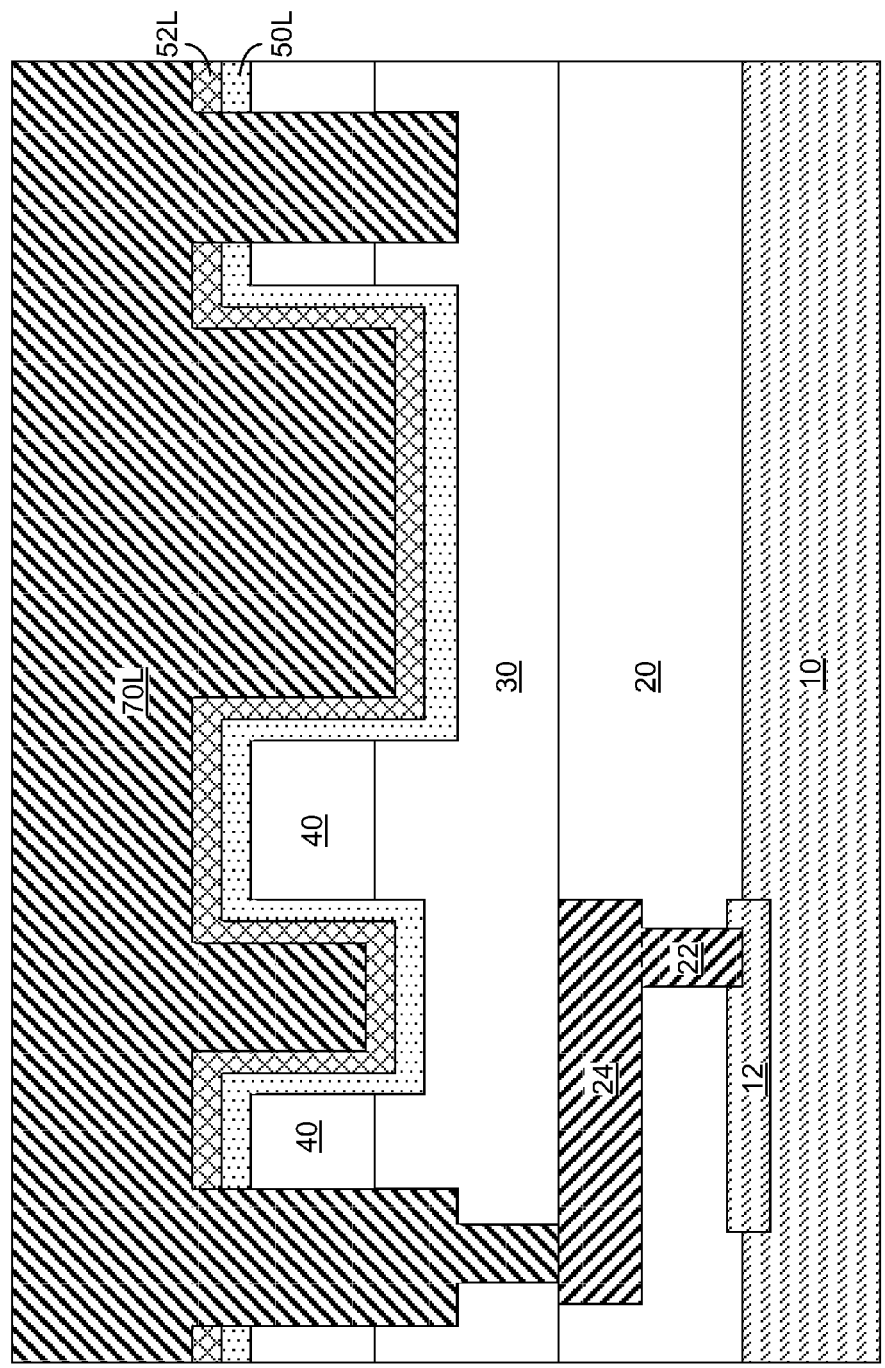
FIG. 6 is a vertical cross-sectional view of the exemplary structure of FIG. 5 after deposition of a conductive material layer according to an embodiment of the present disclosure.

Referring to FIG. 6, a conductive material layer 70L is deposited to fill the at least one recessed region and the at least one cavity (33, 31), each of which includes a line trench 33 and optionally includes at least one via cavity 31. The conductive material layer 70L includes a metallic material, which can include W, Al, and Cu. The conductive material layer 70L may include at least one metallic liner (not shown), which can have the same or different composition as the metallic liner layer 52L. Exemplary materials that can be employed for the at least one metallic liner included within the conductive material layer 70L include, but is not limited to, TaN, TiN, WN, and WC. In one embodiment, the metallic liner layer 52L can have a different composition than any metallic liner in the conductive material layer 70L. In another embodiment, the metallic liner layer 52L can have a different thickness than any metallic liner present in the conductive material layer 70L. In yet another embodiment, a metallic liner layer in the conductive material layer 70L can have the same composition as the metallic liner layer 52L, and the material of the metallic liner in the conductive material layer 70L is added to the thickness of the metallic liner layer 52L so that the total thickness of the metallic liner layer 52L is different from, i.e., greater than, the thickness of the metallic liner within the conductive material layer 70L. In any case, the metallic liner layer 52L is different from any metallic liner present in the conductive material layer 70L by at least one of atomic composition and thickness.

The conductive material layer 70L can be deposited by any method known in the art including, but not limited to, physical vapor deposition (PVD), chemical vapor deposition (CVD), electroplating, electroless plating, and combinations thereof. Typically, the conductive material layer 70L includes a high conductivity metal such as Cu or Al.

Figure 7:
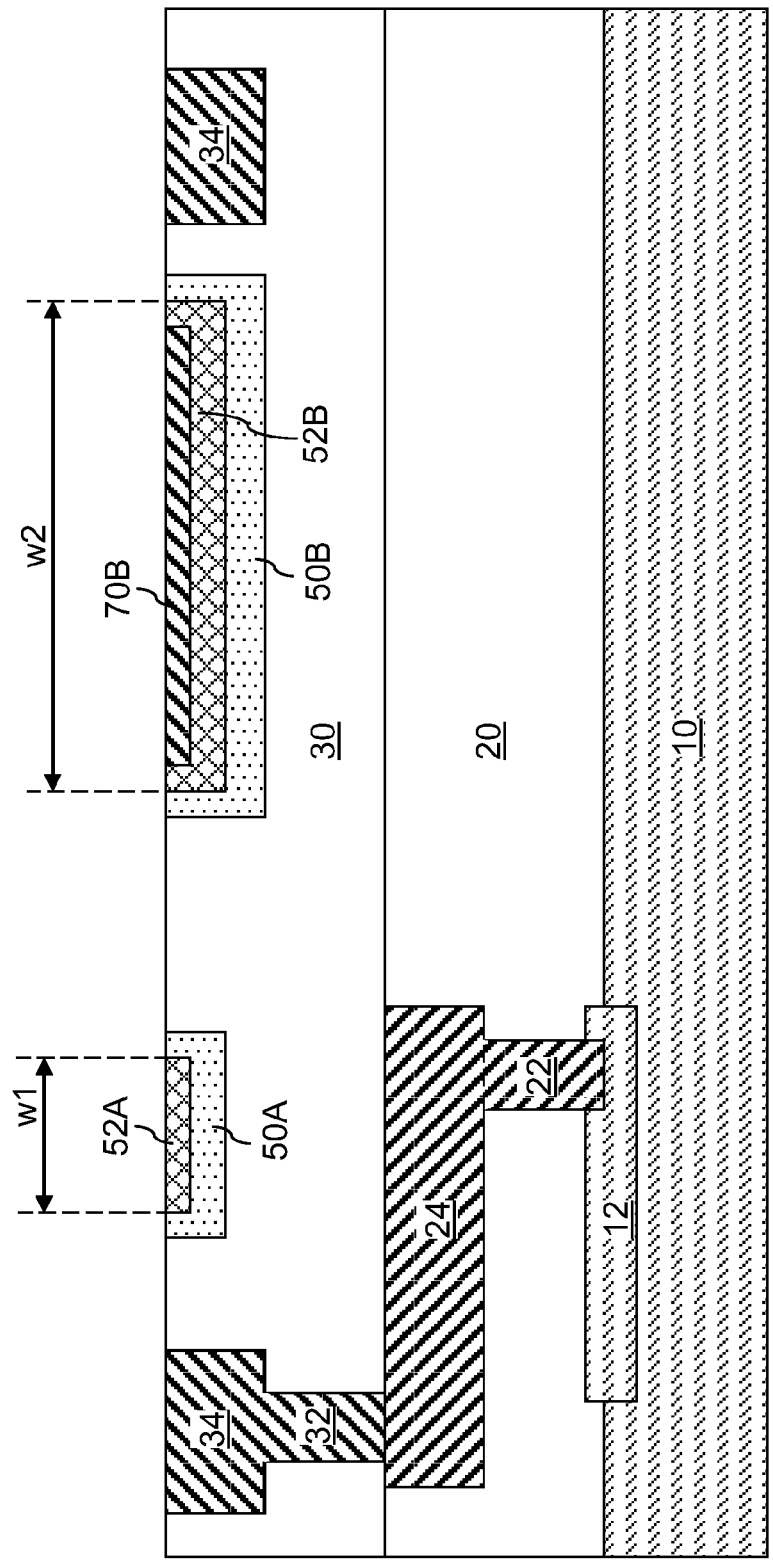
FIG. 7 is a vertical cross-sectional view of the exemplary structure of FIG. 6 after planarization and formation of at least one BEOL resistor according to an embodiment of the present disclosure.

Referring to FIG. 7, materials above the topmost surface of the interconnect-level dielectric material layer 30 is removed by planarization, which can employ, for example, a recess etch, chemical mechanical planarization (CMP), or a combination thereof. Thus, the excess portion of the conductive material layer 70L above the topmost surface of the interconnect-level dielectric material layer 30, all of the disposable dielectric material layer 40, and the portions of the metallic liner layer 52L and the dielectric liner layer 50L above the topmost surface of the interconnect-level dielectric material layer 30 are removed. The planarized surface of the remaining materials is coplanar, i.e., located within the same horizontal plane.

Resistor structures are provided in the areas of the at least one recessed region (R1, R2; See FIGS. 2 and 3). Depending on the depths (e.g., the first depth d1 and the second depth d2; See FIG. 2) of the recessed regions as initially formed within the interconnect-level dielectric material layer 30 and the thickness of the dielectric liner layer 50L (See FIG. 3), a resistor may consist of a remaining portion of the metallic liner layer 52L (See FIG. 6) or a stack of a remaining portion of the metallic liner layer 52L and a remaining portion of the conductive material layer 70L (See FIG. 6).

For example, a first resistor formed in the first area, which is the area of the first recessed region R1 (See FIG. 2), can consist of a first metallic liner 52A, and a second resistor formed in the second area, which is the area of the second recessed region (See FIG. 2), can include a stack of a second metallic liner 52B and a conductive material portion 70B. The first metallic liner 52A and the second metallic liner 52B are remaining portions of the metallic liner layer 52L, and the conductive material portion 70B is a remaining portion of the conductive material layer 70L. As such, the conductive material portion 70B is a metal portion contacting a top surface of the center portion of the second metallic liner 52B and including the same conductive material as the conductive material layer (See FIG. 6).

The conductive material portion 70B is embedded within the second metallic liner 52B. The topmost surfaces of the first metallic liner 52A, the second metallic liner 52B, and the conductive material portion 70B are coplanar with the topmost surface of the interconnect-level dielectric material layer 30. The thickness of the first metallic liner 52A can be equal to, or less than, the thickness of the metallic liner layer 52L as originally deposited (See FIG. 3). The first metallic liner 52A has a constant thickness throughout. The thickness of the planar portion of the second metallic liner 52B underneath the conductive material portion 70B is the same as the thickness of the metallic liner layer 52L as originally deposited. The top surface of the planar portion of the second metallic liner 52B underneath the conductive material portion 70B is recessed relative to the topmost surface of the second metallic liner 52B. The topmost surface of the second metallic liner 52B is located at a periphery of the second metallic liner 52B, which laterally surrounds the conductive material portion 70B. The first metallic liner 52A and the second metallic liner 52B can have the same composition because both metallic liners (52A, 52B) are remaining portions of the metallic liner layer 52L (See FIG. 6).

The sheet resistance of the first resistor and the sheet resistance of the second resistor can be different due to two factors. First, the first metallic liner 52A can be less than the thickness of the second metallic liner 52B as measured in the planar portion underneath the conductive material portion 70B. Second, the sheet resistance of the second resistor is further reduced due to the presence of the conductive material portion 70B, which can include a material having a higher conductivity than the material of the first and second metallic liners (52A, 52B). The average sheet resistance of a resistor change with the size of the resistor. Thus, the combination of these two factors enables construction of resistors of which the resistance varies more than inversely linearly with the lateral dimensions of the resistors.

In an illustrative example of the variation of the sheet resistance with the area of a resistor, the first resistor and the second resistor have the same length L, i.e., the same dimension in the direction of the current flow. The first resistor can have a first width w1 corresponding to the width of the first metallic liner 52A, and the second resistor can have a second width w2 corresponding to the width of the second metallic liner 52B. The resistance R of each resistor can be calculated employing the formula: $R=\rho \times L/A$, in which $\rho$ is the average resistivity of the resistor, and A is the vertical cross-sectional area of the resistor in the direction perpendicular to the current flow. The width of the resistor affects the resistance R via changes in A that is more than linear to the change in the width because the recess depth, and consequently the thickness of the resistor, can increase with an increase in the width of the resistor. Thus, $A \propto w^{\alpha}$, in which $\alpha$ is greater than 1.0. Further, the average resistivity $\rho$ of the resistor decreases with an increase in the width of the resistor because the conductive material portion 70B typically has a lower resistivity than the resistivity of the second metallic liner 52B, i.e., $\rho \propto w^{\beta}$ to first approximation, in which $\beta$ is greater than 1.0. Thus, the resistance of a resistor has a function dependence on the width w of the resistor in the functional form: $R \propto w^{\alpha+\beta}$.

The first metallic liner 52A is embedded in a first dielectric liner 50A, and the second metallic liner 52B is embedded in a second dielectric liner 50B. The first dielectric liner 50A and the second dielectric liner 50B are remaining portions of the dielectric liner layer 50L (See FIG. 6). The top surfaces of the first dielectric liner 50A and the second dielectric liner 50B are coplanar with the topmost surfaces of the interconnect-level dielectric material layer 30, the first metallic liner 52A, the second metallic liner 52B, and the conductive material portion 70B. The first dielectric liner 50A and the second dielectric liner 50B are laterally spaced from each other remaining portions of the conductive material layer 70L (See FIG. 6).

At least one metal interconnect structure is formed by the remaining portion(s) of the conductive material layer 70L (See FIG. 6) formed within the at least one cavity (33, 31; see FIG. 6). The at least one metal interconnect structure can include at least one metal line 34 and at least one metal via 32, which include the same material as the conductive material layer 70L and embedded in the interconnect-level dielectric material layer 30. A top surface of each of the at least one metal line 34 is coplanar with the topmost surface of the interconnect-level dielectric material layer 30, and a bottom surface of the at least one metal via 32 can be coplanar with the bottommost surface of the interconnect-level dielectric material layer 30 or can be recessed into the at least one conductive line structure 24 embedded in the underlying-level dielectric layer 20. Each of the at least one metal via 32 can be of integral construction with one of the at least one metal line 34. Because the at least one metal interconnect structure (34, 32) and the conductive material portion 70B are derived from the same conductive material layer 70L, the at least one metal interconnect structure (34, 32) and the conductive material portion 70B can have the same material composition.

In one embodiment, the bottom surface of each of the at least one metal line 34 is located below the bottom surfaces of the first metallic liner 52A and the second metallic liner 52B. Because the highest level for the bottom surfaces of the at least one metal interconnect structure (34, 32) is the bottom surface(s) of the at least one metal liner 34, the vertical distance between the top surface of the at least one metal interconnect structure (34, 32) and any planar bottom surface of the metal interconnect structure (34, 32) can be greater than the vertical distance between the topmost surfaces of the metallic liners (52A, 52B) and the bottommost surfaces of the metallic liners (52A, 52B). By limiting the vertical extent of the metallic liners (52A, 52B), parasitic coupling between the resistors and any conductive structure in the underlying-level dielectric layer 20 can be minimized.

Figure 8:
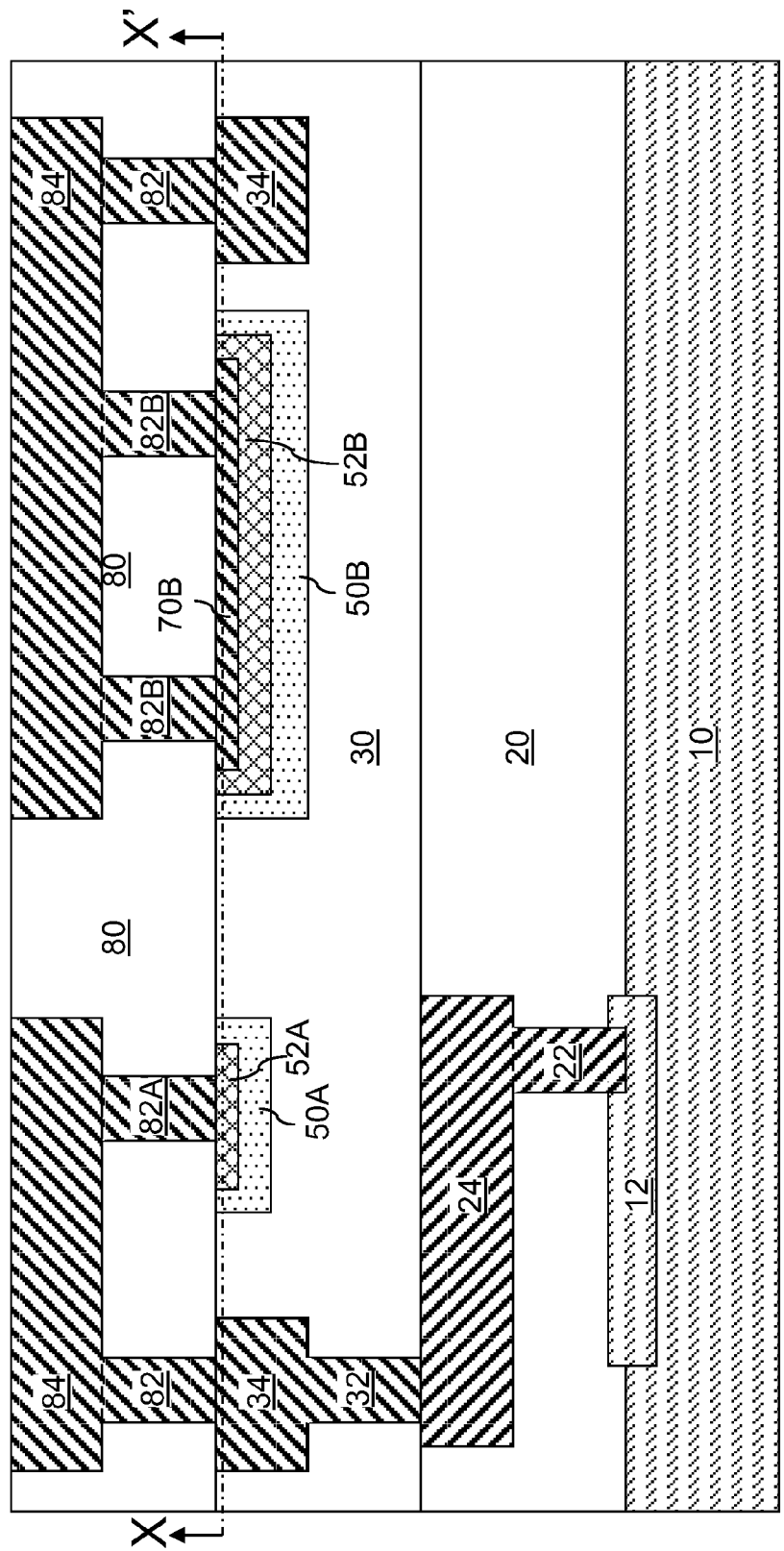
FIG. 8 is a vertical cross-sectional view of the exemplary structure of FIG. 7 after formation of an overlying-level dielectric material layer and additional metal interconnect structures therein according to an embodiment of the present disclosure.
Figure 9:
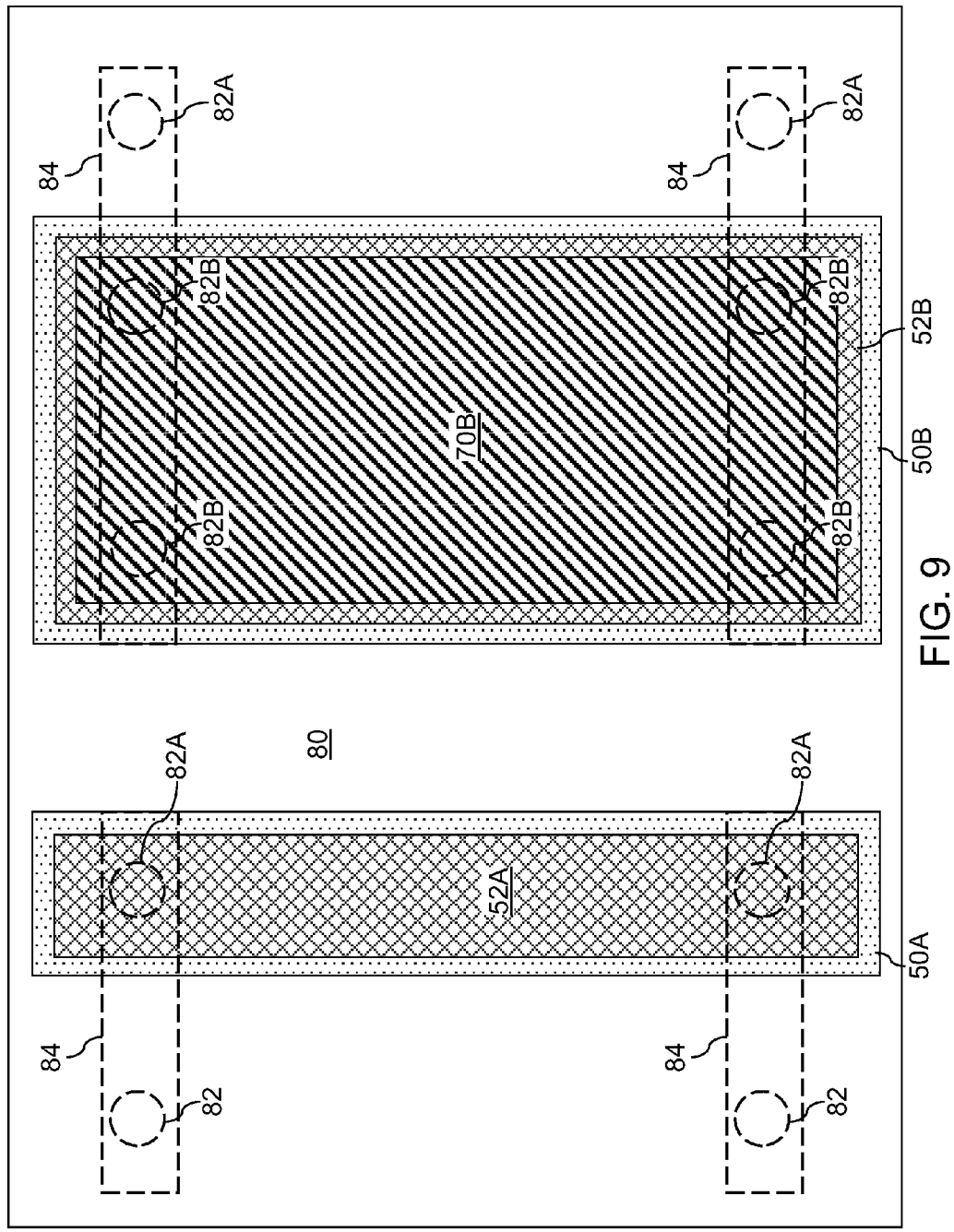
FIG. 9 is a horizontal cross-sectional view of the exemplary structure of FIG. 8 along a horizontal plane X-X' at the processing step of FIG. 8 according to an embodiment of the present disclosure. Elements in an overlying-level dielectric material layer are juxtaposed in dotted lines to illustrate electrical connections to the elements in the horizontal plane X-X'.

Referring to FIGS. 8 and 9, an overlying-level dielectric material layer 80 is formed over the at least one metallic liner (52A, 52B), the conductive material portion 70B, the at least one metal interconnect structure (34, 32), and the interconnect-level dielectric material layer 30. The material composition and the thickness of the overlying-level dielectric material layer 80 can be the same as the material composition and the thickness of the interconnect-level dielectric material layer 30. In this case, the overlying-level dielectric material layer 80 can be deposited employing the same methods as the interconnect-level dielectric material layer 30. Optionally, additional resistors can be formed in the overlying-level dielectric material layer 80 employing the same processing steps as described in FIGS. 1-7 including formation of an additional disposable dielectric material layer (not shown) above the overlying-level dielectric material layer 80. Alternately, the overlying-level dielectric material layer 80 can include a conventional dielectric material such as undoped silicate glass (USG), doped silicate glass, silicon nitride, or a combination thereof. Further, the thickness of the overlying-level dielectric material layer 80 can be adjusted as needed.

Overlying-level metal liners 84 and overlying-level contact vias (82, 82A, 82B) can be formed in the overlying-level dielectric material layer 80 employing methods known in the art. The overlying-level contact vias (82, 82A, 82B) can include at least two first metal contact vias 82A that provide electrical contact to the first resistor by directly contacting the top surface of the first metallic liner 52A. Further, the overlying level contact vias (82, 82A, 82B) include at least two second metal contact vias 82B that provide electrical contact to the second resistor by directly contacting the conductive material portion 70B. Thus, for each resistor embedded in the interconnect-level dielectric material layer 30, at least two metal contact vias can be provided in the overlying-level dielectric material layer 80 so that the at least two metal contact vias contact, or are conductively connected to, the at least one metallic liner included in the resistor.

Figure 10:
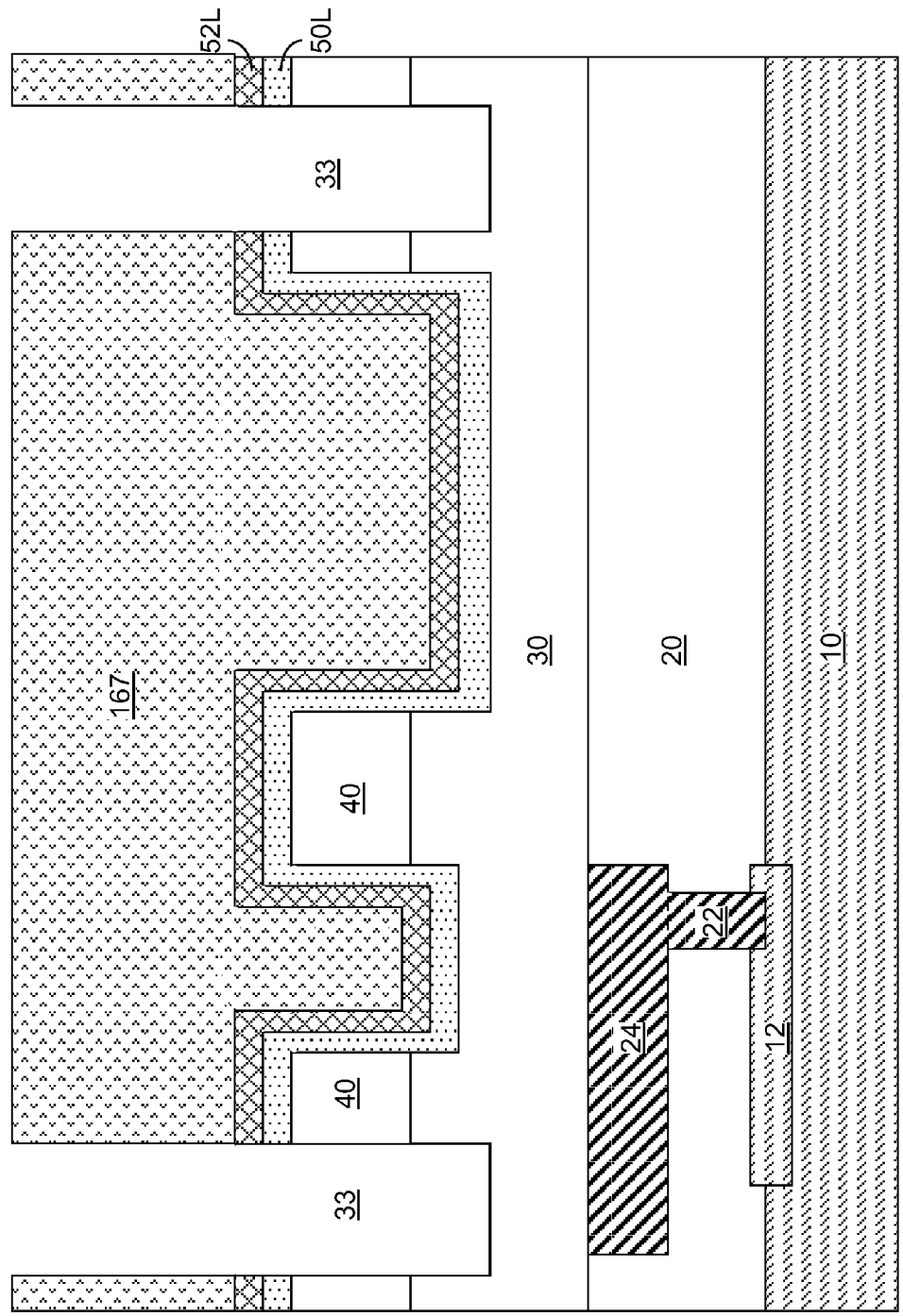
FIG. 10 is a vertical cross-sectional view of an alternate exemplary structure derived from the exemplary structure of FIG. 4 after formation of at least one line cavity in the interconnect-level dielectric material layer according to an alternate embodiment of the present disclosure.

Referring to FIG. 10, an alternate exemplary structure can be derived from the exemplary structure of FIG. 4 by forming at least one line cavity 33 through the disposable dielectric material layer 40 and in an upper portion of the interconnect-level dielectric material layer 30 according to an alternate embodiment of the present disclosure, which employs a line-first dual damascene process instead of a via-first dual damascene process illustrated in FIGS. 4 and 5. For example, a first photoresist 167 is applied over the metallic liner layer 52L and is lithographically pattern to include at least one hole in areas outside the areas of the at least one recessed regions (R1, R2; see FIG. 3), i.e., in areas in which the topmost surface of the disposable dielectric material layer 40 is present. The first photoresist 167 may include an optically planarizing layer (OPL; not separately shown) including a planarizing polymer and/or at least one anti-reflective coating (ARC) layer (not separately shown) as known in the art. The first photoresist 167 can be lithographically patterned to include at least one hole that corresponds to the location(s) of at least one metal line to be subsequently formed in the interconnect-level dielectric material layer 30.

The pattern in the first photoresist 167 is transferred through the metallic liner layer 52L, the dielectric liner layer 50L, the disposable dielectric material layer 40, and an upper portion of the interconnect-level dielectric material layer 30 to form at least one line cavity 33, i.e., at least one cavity having a horizontal cross-sectional area of a metal line to be subsequently formed, within the disposable dielectric material layer 40 and the upper portion of the interconnect-level dielectric material layer 30. The pattern transfer from the first photoresist 167 into the metallic liner layer 52L, the dielectric liner layer 50L, the disposable dielectric material layer 40, and the upper portion of the interconnect-level dielectric material layer 30 can be effected by an anisotropic etch, such as a reactive ion etch, that employs the first photoresist 167 as an etch mask. In one embodiment, the etch processes can detect the top surface of the interconnect-level dielectric material layer 30 and subsequently employ a timed etch to control the depth of the at least one line trench 33 into the interconnect-level dielectric material layer 30 from the topmost surface of the interconnect-level dielectric material layer 30. The first photoresist 167 is subsequently removed, for example, by ashing.

Figure 11:
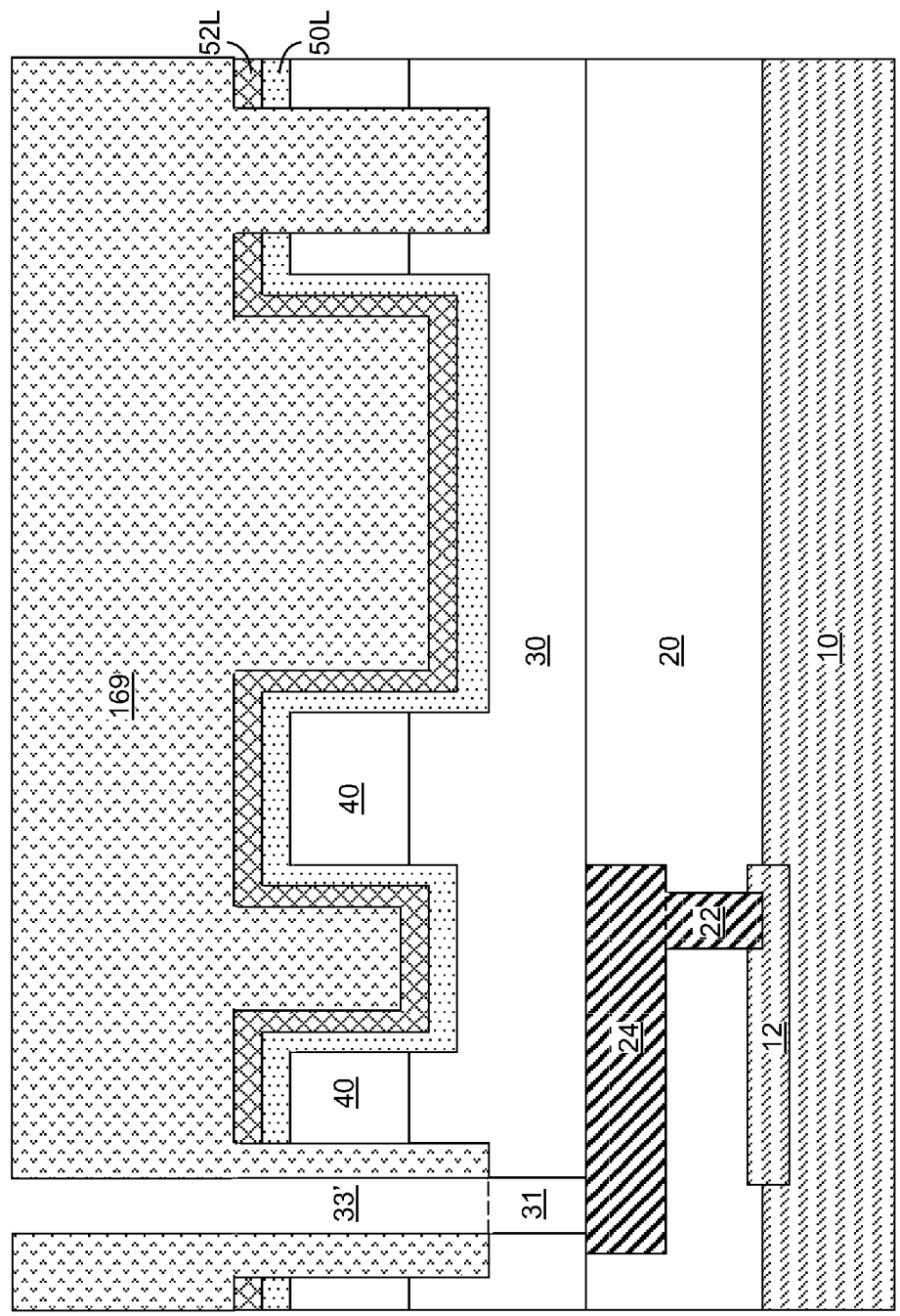
FIG. 11 is a vertical cross-sectional view of the alternate exemplary structure of FIG. 10 after formation of at least one via cavity in the interconnect-level dielectric material layer according to the alternate embodiment of the present disclosure.

Referring to FIG. 11, a second photoresist 169 is applied over the metallic liner layer 52L and is lithographically patterned to include at least one hole in areas outside the areas of the at least one recessed regions (R1, R2; see FIG. 3). The second photoresist 69 may include an optically planarizing layer (OPL; not separately shown) including a planarizing polymer and/or at least one anti-reflective coating (ARC) layer (not separately shown) as known in the art. The second photoresist 169 can be lithographically patterned to include at least one hole that corresponds to the location(s) of at least one contact via to be subsequently formed in the interconnect-level dielectric material layer 30. In this case, the at least one hole in the second photoresist 169 can be located within an area of the at least a portion of the at least one line trench 33, and can have a horizontal cross-sectional area corresponding to the contact vias to be subsequently formed.

The pattern in the second photoresist 169 is transferred through a lower portion of the interconnect-level dielectric material layer 30 to form at least one via trench 31 therein. The pattern transfer from the second photoresist 69 into the lower portion of the interconnect-level dielectric material layer 30 can be effected by an anisotropic etch, such as a reactive ion etch, that employs the second photoresist 169 as an etch mask. The at least one via trench 31 extends at least from the bottommost surface of the at least one line cavity 33 (See FIG. 10) to the bottommost surface of the interconnect-level dielectric material layer 30.

Each of the at least one via cavity 31 is contiguously connected to one of the at least one line trench 33, which collectively form a single contiguous cavity extending from the topmost surface of the metallic liner layer 52L to the bottommost surface of the interconnect-level dielectric material layer 30. Only at least one via-overlying region 33' of the at least one line trench 33 is not covered by the second photoresist 169, while the rest of the area of the at least one line trench 33 and areas outside of the one line trench 33 are covered by the second photoresist 169. The vertical distance between the bottom surface of the at least one line trench 33 and the bottom surface of the interconnect-level dielectric material layer 30, i.e., the height of the at least one via cavity 31, can be from 25% to 75%, and typically from 40% to 65% of the total thickness of the interconnect-level dielectric material layer 30, although lesser and greater vertical distances can also be employed. The second photoresist 69 is subsequently removed, for example, by ashing.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of forming a structure comprising:
    forming at least one recessed region in a dielectric material layer located on a substrate, wherein a surface of said dielectric material layer is present at a bottom of said at least one recessed region;
    depositing a metallic liner layer in said at least one recessed region;
    forming at least one cavity in said dielectric material layer after depositing said metallic liner layer, wherein said cavity extends to a bottom surface of said dielectric material layer;
    filling said at least one cavity and said at least one recessed region with a metallic material; and
    planarizing said metallic material to form a resistor structure and at least one metal interconnect structure, wherein said resistor structure is formed in one of said at least one recessed region and includes a metallic liner that is a remaining portion of said metallic liner layer, and wherein said at least one metal interconnect structure is formed within said at least one cavity and includes said metallic material.

2. The method of claim 1, further comprising forming a disposable dielectric material layer on said dielectric material layer, wherein said at least one recessed region and said at least one cavity are formed through said disposable dielectric material layer.

3. The method of claim 2, further comprising removing said disposable dielectric material layer during said planarizing of said metallic material.

4. The method of claim 1, further comprising depositing a dielectric liner layer directly on surfaces of said dielectric material layer in said at least one recessed region, wherein said metallic liner layer is deposited directly on said dielectric liner layer.

5. The method of claim 4, wherein said at least one cavity is formed through said metallic liner layer and said dielectric liner.

6. The method of claim 4, wherein said dielectric material layer has a dielectric constant less than 3.9, and said dielectric liner layer has a dielectric constant of at least 3.9.

7. The method of claim 1, wherein said at least one recessed region includes a first recessed region and a second recessed region having a greater depth than said first recessed region.

8. The method of claim 7, wherein a first metallic liner including a remaining portion of said metallic liner layer within said first recessed region has a topmost surface that is coplanar with a topmost surface of said dielectric material layer after said planarization, and a second metallic liner including a remaining portion of said metallic liner layer within said second recessed region has a top surface that is recessed below said topmost surface of said dielectric material layer after said planarization.

9. The method of claim 8, wherein a remaining portion of said metallic material present on said top surface of said second metallic liner.

10. The method of claim 9, wherein said remaining portion of said metallic material has a topmost surface that is coplanar with said topmost surface of said dielectric material layer after said planarization.

11. The method of claim 7, wherein said first metallic liner has a lesser thickness than and horizontal portion of said second metallic liner.

12. The method of claim 1, further comprising:
    forming an overlying-level dielectric material layer over said at least one metallic liner after said planarizing of said metallic material; and
    forming at least two metal contact vias in said overlying-level dielectric material layer, wherein said at least two metal contact vias contact, or are conductively connected to, said at least one metallic liner.

13. The method of claim 1, wherein said resistor structure is embedded in said dielectric material layer and does not contact said metal interconnect structure.

14. The method of claim 13, wherein said one of said at least one metallic liner has a thickness that is less than a vertical distance between a top surface of said metal interconnect structure and a planar bottom surface of said at least one metal interconnect structure.

15. The method of claim 1, wherein an entire top surface of said resistor structure extends throughout an area defined by an outer periphery of said metallic liner.

16. The method of claim 15, wherein said entire top surface of said resistor structure is coplanar with said topmost surface of said dielectric material liner.

17. The method of claim 1, wherein an entirety of said resistor structure has a same thickness throughout.

18. The method of claim 1, wherein said metallic liner includes a different material than said at least one metal interconnect structure.

19. The method of claim 18, wherein said metallic liner includes TaN, TiN, WN, or a combination thereof, and said metal layer includes Cu or Al.

20. The method of claim 1, wherein a portion of said metallic material is formed above said metallic liner and within said resistor structure after said planarizing of said metallic material.

* * * * *